US005302212A

United States Patent [19]

Desbiendras et al.

[11] Patent Number: 5,302,212

[45] Date of Patent: Apr. 12, 1994

[54] USE OF (PERFLUOROALKYL)ETHYLENES AS CLEANING OR DRYING AGENTS, AND COMPOSITIONS WHICH CAN BE USED FOR THIS PURPOSE

[75] Inventors: Daniel Desbiendras, Villetaneuse; Jean-Jacques Martin, Bois-Colombes; Pascal Michaud, Saint-Gratien, all of France

[73] Assignee: Societe Atochem, France

[21] Appl. No.: 658,270

[22] Filed: Feb. 20, 1991

[30] Foreign Application Priority Data

Feb. 20, 1990 [FR] France ................................ 90 02011

[51] Int. Cl.[5] ........................ C23G 5/028; H05K 3/26; C11D 7/30; C11D 7/50

[52] U.S. Cl. ........................................ 134/40; 134/12; 134/31; 134/38; 134/42; 252/162; 252/170; 252/171; 252/172; 252/194; 252/364; 252/DIG. 9

[58] Field of Search ........................ 134/12, 31, 38, 39, 134/40, 42; 252/194, 162, 170, 171, 172, 364, DIG. 9

[56] References Cited

U.S. PATENT DOCUMENTS

| | | | |
|---|---|---|---|
| 2,551,639 | 5/1951 | Feasley et al. | 252/364 |
| 3,389,187 | 6/1968 | Miller | 252/364 |
| 3,907,576 | 9/1975 | Dear et al. | 106/13 |
| 3,911,035 | 10/1975 | LaLande, Jr. et al. | 252/364 |
| 5,037,573 | 8/1991 | Merchant | 252/364 |
| 5,059,728 | 10/1991 | Li et al. | 252/364 |
| 5,064,559 | 11/1991 | Merchant et al. | 252/364 |
| 5,064,560 | 11/1991 | Merchant | 252/364 |
| 5,076,956 | 12/1991 | Anton | 252/364 |

FOREIGN PATENT DOCUMENTS 1244256 8/1971 United Kingdom .

OTHER PUBLICATIONS

Derwent Publications Ltd. Abstract, 718, Abstract of J59219366 (Dec. 1984).
Derwent Publications Ltd. Abstract 719, Abstract J59219367 (Dec. 1984).

*Primary Examiner*—Linda Skaling
*Attorney, Agent, or Firm*—Morgan & Finnegan

[57] ABSTRACT

To replace 1,1,2-trichloro-1,2,2-trifluoroethane (F113) in its applications to the cleaning and drying of solid surfaces, the invention propose to employ a (perfluoroalkyl) ethylene of formula:

$$R_fCH=CH_2$$

in which $R_f$ denotes a linear or branched perfluoroalkyl radical containing from 3 to 6 carbon atoms.

In contrast to F113, (perfluoroalkyl)ethylenes are not liable to degrade stratospheric ozone.

20 Claims, No Drawings

USE OF (PERFLUOROALKYL)ETHYLENES AS CLEANING OR DRYING AGENTS, AND COMPOSITIONS WHICH CAN BE USED FOR THIS PURPOSE

FIELD OF THE INVENTION

The present invention relates to the field of fluorinated hydrocarbons and its subject is more particularly the use of (perfluoroalkyl)ethylenes as cleaning or drying agents for solid surfaces.

BACKGROUND OF THE INVENTION

Because of its physicochemical characteristics, especially its nonflammability, its high wetting power, its low solvent power and its low boiling point, 1,1,2-trichloro-1,2,2-trifluoroethane (known in the profession by the designation F113) is at present widely employed in industry for cleaning and degreasing very diverse solid surfaces (made of metal, glass, plastics or composites). In electronics in particular, F113 has found an important application in the defluxing and cold cleaning of printed circuits. Other examples of applications of F113 which may be mentioned are degreasing of metal components and cleaning of mechanical components of high quality and of high precision such as, for example, gyroscopes and military, aerospace or medical hardware. In its diverse applications, F113 is frequently used in combination with other organic solvents (for example methanol), in particular in the form of azeotropic or pseudoazeotropic mixtures which do not demix and which, when employed at reflux, have substantially the same composition in the vapor phase as in the liquid phase.

F113 is also employed in industry for drying various solid substrates (metal, plastic, composite or glass components) after their cleaning in an aqueous medium. In this application, which is intended to remove the water remaining on the surface of the cleaned substrates, F113 often has one or more surfactants added to it. See especially French Patent Nos. 2,353,625, 2,527,625, and European Patent Nos. 090,677 and 189,436 and the references mentioned in these patents.

Unfortunately, F113 belongs to the completely halogenated chlorofluorocarbons which are at present suspected of attacking or of degrading stratospheric ozone. Products which are free from a destructive effect on ozone and which are capable of replacing F113 in its various applications are therefore sought after.

DESCRIPTION OF THE INVENTION

It has now been found that (perfluoroalkyl)ethylenes of formula:

$$R_f\text{—}CH\text{=}CH_2$$

in which $R_f$ denotes a linear or branched perfluoroalkyl radical containing from 3 to 6 carbon atoms, exhibit physicochemical characteristics similar to those of F113 and, in contrast to the latter, are not liable to degrade stratospheric ozone.

Furthermore, these compounds are particularly stable against oxidation and they do not damage the plastic materials (polystyrene, ABS . . . ) or the elastomers such as ethylenepropylene copolymers.

The subject of the invention is therefore the use of a (perfluoroalkyl)ethylene of formula (I) as a substitute for F113 in the latter's diverse applications. Cleaning or drying compositions based on a (perfluoroalkyl)ethylene also form part of the present invention.

The compounds of formula (I) can be obtained on an industrial scale by processes which are known per se, for example by a two-stage process consisting successively in:

the addition of ethylene to the corresponding perfluoroalkyl iodide $R_fI$ in the presence of a catalyst based on copper and ethanolamine, and the dehydroiodination of the iodide $R_f\text{—}CH_2CH_2$, thus obtained, in the presence of alcoholic potassium hydroxide.

Among the compounds of formula (I) according to the invention, that more particularly preferred is (n-perfluorobutyl)ethylene $C_4F_9\text{—}CH\text{=}CH_2$ which, as shown in the table which follows, exhibits characteristics which are very closely similar to those of F113, except insofar as the ozone-depletion potential (O.D.P.) is concerned.

| Characteristics | F113 | $C_4F_9CH\text{=}CH_2$ |
|---|---|---|
| Boiling point (°C.) | 47.6 | 59 |
| Surface tension at 25° C. (mN m$^{-1}$) | 19 | 13.3 |
| Relative density at 20° C. | 1.57 | 1.46 |
| Flammability | nil | nil |
| Flash point | nil | nil |
| Solvent power (KBV at 25° C.) | 31 | 9 |
| Solubility of water (ppm) | 110 | 72 |
| O.D.P. | 0.78 | 0 |

The cleaning or drying techniques employing F113, and the various compositions based on F113 which are used for these applications are well known to the specialist and are described in the literature. Consequently, to make use of the present invention, it suffices for the specialist to replace F113 with substantially the same volume quantity of a (perfluoroalkyl)ethylene of formula (i), preferably (n-perfluorobutyl)ethylene $C_4F_9CH\text{=}CH_2$.

As in the case of F113, the (perfluoroalkyl)ethylenes of formula (I) can be employed by themselves or mixed with each other or with other organic solvents which are liquid at room temperature, for example with alcohols such as methanol, ethanol, and isopropanol, ketones such as acetone, esters such as methyl or ethyl acetate and ethyl formate, ethers such as methyl tert-butyl ether and tetrahydrofuran, acetals such as 1,1-dimethoxyethane and 1,3-dioxolane, or chlorinated or unchlorinated hydrocarbons such as methylene chloride, trichloroethylene and 1,1,1-trichloroethane, 2-methylpentane, 2,3-dimethylbutane, n-hexane and 1-hexene.

A particularly advantageous mixture f or cleaning operations is that containing 85 to 98% by weight of the compound $C_4F_9CH\text{=}CH_2$ and from 2 to 15% of methanol. In this range, in fact, there exists an azeotrope whose boiling point is 46.3° C. at normal atmospheric pressure (1.013 bar) and the mixture has a pseudoazeotropic behavior, that is to say that the composition of the vapor and liquid phases is substantially the same, which is particularly advantageous for the intended applications. The content of compound $C_4F_9CH\text{=}CH_2$ is preferably chosen between 90 and 95% by weight and that of methanol between 5 and 10% by weight. In addition, a mixture of this kind has the great advantage of not exhibiting any flash point in standard conditions of determination (ASTM standard D 3828) and is therefore nonflammable. The $C_4F_9CH{=}CH_2$/methanol azeotrope is a positive azeotrope, since its boiling point (46.3° C.) is lower than those of the two constituents ($C_4F_9CH{=}CH_2$ : 59° C. and methanol : 65° C.).

Other examples of particularly advantageous, binary or ternary mixtures are the following (% by weight):

$C_4F_9CH{=}CH_2$ (91 to 98%)+isopropanol (9 to 2%)

$C_4F_9CH{=}CH_2$ (41 to 51%)+methylene chloride (59 to 49%)

$C_4F_9CH{=}CH_2$ (89 to 97%)+trichloroethylene (11 to 3%)

$C_4F_9CH{=}CH_2$ (83 to 90%) +1,3-dioxolane (17 to 10%)

$C_4F_9CH{=}CH_2$ (84.8 to 97.8%)+methanol (15 to 2%)+methyl acetate (0.2 to 2.2%)

$C_4F_9CH{=}CH_2$ (90 to 98%)+isopropanol (9 to 1%)+1,3-dioxolane (1 to 7%)

$C_4F_9CH{=}CH_2$ (90.95 to 97.95%)+isopropanol (9 to 2%)+1,1-dimethoxyethane (0.05 to 1%)

As in known cleaning compositions based on F113, the cleaning compositions based on (perfluoroalkyl-)ethylene according to the invention can, if desired, be stabilized against hydrolysis and/or radical attacks liable to occur in cleaning processes, by adding thereto a conventional stabilizer such as, for example, a nitroalkane (nitromethane, nitroethane, etc.), an alkylene (propylene, butylene, isoamylene, etc.) oxide or a mixture of these compounds, it being possible for the proportion of stabilizer to range from 0.01 to 5% relative to the total weight of the composition.

The suitability of the (perfluoroalkyl) ethylenes according to the invention for removing the water remaining on the surface of substrates after their cleaning in an aqueous medium has been demonstrated, in comparison with F113, by a test consisting in determining the quantity of water remaining on a moist support after immersion in the drying solvent. The test is carried out in the following manner:

A grid of 100% polyamide fabric weighing 8.4 mg/cm$^2$ and 5×2 cm in size is immersed in water for 30 seconds and is then allowed to drain without shaking and is then immersed for 10 seconds in 50 ml of absolute alcohol. The concentration of water in the alcohol is then determined by the Karl Fischer method and this concentration acts as a control.

The same grid is again immersed in water for 30 seconds and is then allowed to drain without shaking and is then immersed for 5 minutes under ultrasonics in 50 ml of F113 or of (n-perfluorobutyl)ethylene. The grid is then immersed for 10 seconds in 50 ml of absolute alcohol and the concentration of water in the alcohol is then measured as above. The results thus obtained are collated in the following table:

| | Concentration of water in the alcohol (in ppm) |
|---|---|
| Alcohol (control) | 1966 |
| F113 | 301 |
| $C_4F_9CH{=}CH_2$ | 445 |

These results show that (n-perfluorobutyl) ethylene removes water substantially in the same way as F113.

The compositions intended for drying (removing water from) solid substrates after cleaning in an aqueous medium may contain the same additives as the drying compositions based on F113, in a proportion ranging from 0.01 to 5% by weight (preferably from 0.1 to 3%). These well-known additives are generally surface-active agents such as, for example, amine mono- or dialkylphosphates, salts of the N-oleylpropylenediamine dioleate type, diamides of the dioleyl oleylamidopropyleneamide type, cationic compounds derived from imidazoline, or compounds resulting from the reaction of a quaternary ammonium hydrochloride with an alkylphosphoric acid in the presence of a fluorinated or unfluorinated amine.

EXAMPLES

The following examples illustrate the invention without limiting it.

EXAMPLE 1

$C_4F_9CH{=}CH_2$/methanol azeotrope a) Demonstration of the azeotrope 100 g of (n-perfluorobutyl) ethylene and 100 g of methanol are introduced into the boiler of a distillation column (30 plates). The mixture is then heated under total reflux for one hour to bring the system to equilibrium. When the temperature is steady (46.3° C.) fraction of approximately 50 g is collected and is analyzed by gas phase chromatography.

Inspection of the results recorded in the following table shows the presence of a $C_4F_9CH{=}CH_2$/methanol azeotrope.

| | Composition (weight %) | |
|---|---|---|
| | $C_4F_9CH{=}CH_2$ | $CH_3OH$ |
| Initial mixture | 50 | 50 |
| Fraction collected at 46.3° C. | 91.8 | 8.2 |

b) Verification of the azeotrope composition 200 g of a mixture containing 92% by weight of $C_4F_9CH{=}CH_2$ and 8% by weight of methanol are introduced into the boiler of an adiabatic distillation column (30 plates). The mixture is then heated to reflux for one hour to bring the system to equilibrium, and a fraction of approximately 50 g is then taken and is analyzed by gas phase chromatography, together with that from the still bottom. The results recorded in the table which follows show the presence of a positive azeotrope since its boiling point is lower than those of the two pure constituents: $C_2F_9CH{=}CH_2$ and methanol.

| | COMPOSITION (weight %) | |
|---|---|---|
| | $C_4F_9CH{=}CH_2$ | $CH_3OH$ |
| Initial Mixture | 92 | 8 |
| Fraction collected | 91.7 | 8.3 |
| Still bottom | 91.8 | 8.1 |

Boiler temperature: 64° C.
Boiling point corrected for 1.013 bar: 46.3° C.

This azeotrope, employed for cleaning soldering flux and degreasing mechanical components gives good results.

EXAMPLE 2

Nitromethane-stabilized composition

Into an ultrasonic cleaning tank are introduced 150 g of a mixture containing 91.9% by weight of $C_4F_9CH{=}CH_2$, 8% of methanol and 0.1% of nitromethane as stabilizer. After the system has been heated to reflux for one hour, an aliquot of the vapor phase is taken. Its analysis by gas phase chromatography shows the presence of nitromethane, which indicates that the mixture is stabilized in the vapor phase.

| | COMPOSITION (weight %) | | |
|---|---|---|---|
| | $C_4F_9CH{=}CH_2$ | $CH_3OH$ | $CH_3NO_2$ |
| Initial Mixture | 91.9 | 8 | 0.1 |
| Vapor phase | 91.85 | 8.1 | 0.05 |

EXAMPLE 3

Propylene oxide-stabilized composition

If Example 2 is repeated, replacing nitromethane with propylene oxide, the following results are obtained:

| | COMPOSITION (weight %) | | |
|---|---|---|---|
| | $C_4F_9CH{=}CH_2$ | $CH_3OH$ | $C_3H_6O$ |
| Initial Mixture | 91.9 | 8 | 0.1 |
| Vapor phase | 91.68 | 8.3 | 0.02 |

EXAMPLE 4

Doubly stabilized composition

Example 2 is repeated, using 0.1% of nitromethane and 0.1% of propylene oxide. The following results are obtained:

| | COMPOSITION (weight %) | | | |
|---|---|---|---|---|
| | $C_4F_9CH{=}CH_2$ | $CH_3OH$ | $CH_3NO_2$ | $C_3H_6O$ |
| Initial Mixture | 91.8 | 8 | 0.1 | 0.1 |
| Vapor phase | 91.73 | 8.2 | 0.05 | 0.02 |

EXAMPLE 5

Cleaning of soldering flux 200 g of the $C_4F_9CH{=}CH_2$/methanol azeotropic composition are introduced into an Annemasse ultrasonic tank and the mixture is then heated to boiling point.

Printed circuits coated with soldering flux and annealed in an oven for 30 seconds at 2200C are immersed for 3 minutes in the boiling liquid under ultrasound, and are then rinsed in the vapor phase for 3 minutes.

After drying in air, complete absence of soldering flux residue is observed.

EXAMPLES 6 to 22

The procedure is as in Example 1, but with methanol replaced by other solvents. The following table shows the normal boiling point (at 1.013 bar) and the composition of the azeotropes.

| | | Weight composition of the azeotrope | | |
|---|---|---|---|---|
| Ex. | Second Solvent | $C_4F_9CH{=}CH_2$ | Second Solvent | B.p. (°C.) |
| 6 | Ethanol | 93.4% | 6.6% | 52.4 |

-continued

| | | Weight composition of the azeotrope | | |
|---|---|---|---|---|
| Ex. | Second Solvent | $C_4F_9CH{=}CH_2$ | Second Solvent | B.p. (°C.) |
| 7 | Isopropanol | 94.5% | 5.5% | 54.7 |
| 8 | Methyl acetate | 33.3% | 66.7% | 51.7 |
| 9 | Ethyl formate | 55% | 45% | 49 |
| 10 | Acetone | 28.5% | 71.5% | 50.8 |
| 11 | 2-Methylpentane | 77.1% | 22.9% | 50.7 |
| 12 | 2,3-Dimethylbutane | 70.3% | 29.7% | 49.5 |
| 13 | n-Hexane | 83.4% | 16.6% | 53.7 |
| 14 | 1-Hexene | 77.3% | 22.7% | 52.5 |
| 15 | n-Propanol | 97% | 3% | 56.6 |
| 16 | Dichloromethane | 46% | 54% | 35.3 |
| 17 | Trichloroethylene | 93% | 7% | 58.2 |
| 18 | 1,1,1-Trichloroethane | 83.5% | 16.5% | 57.4 |
| 19 | Methyl tert-butyl ether | 57.2% | 42.8% | 52.5 |
| 20 | Tetrahydrofuran | 82.6% | 17.4% | 56.3 |
| 21 | 1,3-Dioxolane | 86.5% | 13.5% | 56.3 |
| 22 | 1,1-Dimethoxyethane | 80% | 20% | 55.5 |

EXAMPLES 23 TO 29

Ternary azeotropes 200 g of the $C_4F_9CH{=}CH_2$/methanol azetropic composition of Example 1 and 50 g of a third solvent are introduced into a distillation column (30 plates). The mixture is then heated under total reflux for one hour to bring the system to equilibrium and an aliquot of the condensed phase is withdrawn when the temperature is steady and is analyzed by gas phase chromatography.

The boiling points observed for the ternary compositions are lower than those of the $C_4F_9CH{=}CH_2$ methanol azeotrope, which shows that one is dealing with ternary azeotropes whose weight composition and normal boiling point (at 1.013 bar) are collated in the following table:

| | Example | | | |
|---|---|---|---|---|
| | 23 | 24 | 25 | 26 |
| | Weight Composition (%) | | | |
| $C_4F_9CH{=}CH_2$ | 61 | 90.8 | 71.35 | 75.6 |
| Methanol | 6.5 | 8.0 | 8.05 | 8 |
| Ethyl formate | 32.5 | | | |
| Methyl acetate | | 1.2 | | |
| 1-Hexene | | | 20.6 | |
| n-Hexane | | | | 16.4 |
| Boiling (°C.) | 44.4 | 46.1 | 42.7 | 43.3 |

The composition and the normal boiling point of three other ternary azeotropes are shown in the following table.

| | EXAMPLE | | |
|---|---|---|---|
| | 27 | 28 | 29 |
| | Weight Composition (%) | | |
| $C_4F_9CH{=}CH_2$ | 91 | 56 | 94.2 |
| Isopropanol | 5 | | 5.6 |
| Ethanol | | 4.5 | |
| 1,3-Dioxolane | 4 | | |
| Methyl tert-butyl ether | | 39.5 | |
| 1,1-Dimethoxy-ethane | | | 0.2 |
| Boiling (°C.) | 54.7 | 52.5 | 54.5 |

EXAMPLES 30 TO 32

The procedure is as in Example 1, but with $C_4F_9CH{=}CH_2$ replaced by $C_6F_{13}CH{=}CH_2$ or by iso-$C_3F_7CH{=}CH_2$ and optionally with methanol replaced with ethanol and isopropanol.

The weight composition and the normal boiling point of the azeotropes are shown in the following table:

| | EXAMPLE | | |
|---|---|---|---|
| | 30 | 31 | 32 |
| Constituents | Weight Composition (%) | | |
| iso-$C_3F_7CH{=}CH_2$ | 94.1 | | |
| $C_6F_{13}CH{=}CH_2$ | | 78 | 67.4 |
| Methanol | 5.9 | | |
| Ethanol | | 22 | |
| Isopropanol | | | 32.6 |
| Boiling (°C.) | 25.5 | 72.8 | 72.3 |

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims. The above references are hereby incorporated by reference.

We claim:

1. Process for cleaning a solid surface which comprises removing grease or flux residue by contacting said solid surface with an effective amount of (perfluoroalkyl) ethylene of formula:

$$R_fCH{=}CH_2 \quad (I)$$

in which $R_f$ denotes a linear or branched perfluoroalkyl radical containing from 3 to 6 carbon atoms.

2. Process according to claim 1, wherein the compound of formula (I) is (n-perfluorobutyl)ethylene $C_4F_9CH{=}CH_2$.

3. Process for cleaning a solid surface which comprises removing grease or flux residue by contacting said solid surface with a mixture of an effective amount of (perfluoroalkyl) ethylene or formula:

$$R_fCH{=}CH_2 \quad (I)$$

in which $R_f$ denotes a linear or branched perfluoroalkyl radical containing from 3 to 6 carbon atoms and an effective amount of at least one organic solvent selected from the group consisting of alcohols, ketones, esters, ethers, acetals and chlorinated hydrocarbons or hydrocarbons.

4. Process according to claim 3, wherein said mixture consists essentially of from 85 to 98% by weight of (n-perfluoro-butyl)ethylene and from 2 to 15% of methanol.

5. Process according to claim 4, wherein said mixture consists essentially of from 90 to 95% by weight of (n-perfluorobutyl)ethylene and from 5 to 10% of methanol.

6. Process according to claim 4, wherein said mixture is an azeotrope of about 92% by weight of (n-perfluorobutyl)ethylene and about 8% by weight of methanol which boils at about 46.3° C. at normal atmospheric pressure.

7. Process according to claim 3, wherein said mixture consists essentially of 91 to 98% by weight of (n-perfluorobutyl)ethylene and 2 to 9% of isopropanol.

8. Process according to claim 3, wherein said mixture consists essentially of 41 to 51% by weight of (n-perfluorobutyl)ethylene and 49 to 59% of methylene chloride.

9. Process according to claim 3, wherein said mixture consists essentially of 89 to 97% by weight of (n-perfluorobutyl)ethylene and 3 to 11% of trichloroethylene.

10. Process according to claim 3, wherein said mixture consists essentially of 83 to 90% by weight of (n-perfluorobutyl)ethylene and 10 to 17% of 1,3-dioxolane.

11. Process according to claim 3, wherein said mixture consists essentially of 84.8 to 97.8% by weight of (n-perfluorobutyl)ethylene, 2 to 15% of methanol and 0.2 to 2.2% of methyl acetate.

12. Process according to claim 3, wherein said mixture consists essentially of 90 to 98% by weight of (n-perfluorobutyl)ethylene, 1 to 9% of isopropanol and 1 to 7% of 1,3-dioxolane.

13. Process according to claim 3, wherein said mixture consists essentially of 90.95 to 97.95% by weight of (n-perfluorobutyl)-ethylene, 2 to 9% of isopropanol and 0.05 to 1% of 1,1-dimethoxyethane.

14. Process according to claim 3, wherein an effective amount of at least one stabilizer is present said mixture.

15. Process according to claim 14, wherein the stabilizer is a nitroalkane, an alkylene oxide or a mixture thereof.

16. Process according to claim 14, wherein the proportion of the stabilizer is from 0.01 to 5% of the total weight of said mixture.

17. Method for drying a solid surface comprising removing water from said solid surface by contacting said solid surface with an effective amount of (perfluoroalkyl)ethylene of formula:

$$R_fCH{=}CH_2 \quad (I)$$

in which $R_f$ denotes a linear or branched perfluoroalkyl radical containing from 3 to 6 carbon atoms admixed with an effective amount of at least one surface-active agent.

18. Method according to claim 17, wherein the content of surface-active agent is from 0.01 to 5% by weight.

19. Method according to claim 18 wherein the content of surface-active agent is from 0.1 to 3% by weight.

20. Process according to claim 3, wherein said organic solvent is selected from a group consisting of methanol, ethanol and isopropanol.

* * * * *